United States Patent [19]

Tomita et al.

[11] Patent Number: 5,661,413
[45] Date of Patent: Aug. 26, 1997

[54] PROCESSOR UTILIZING A LOW VOLTAGE DATA CIRCUIT AND A HIGH VOLTAGE CONTROLLER

[75] Inventors: Yasuhiro Tomita, Hyogo; Toshiyuki Shono, Kyoto; Hirokazu Yonezawa, Hyogo, all of Japan

[73] Assignee: Matsushita Electric Industrial Co., Ltd., Osaka, Japan

[21] Appl. No.: 461,403

[22] Filed: Jun. 5, 1995

[30] Foreign Application Priority Data

Jun. 6, 1994 [JP] Japan .................................. 6-123939

[51] Int. Cl.⁶ .............................................. H03K 19/0185
[52] U.S. Cl. .............................................................. 326/80
[58] Field of Search ............................ 326/80, 81, 83, 326/87

[56] References Cited

U.S. PATENT DOCUMENTS

| | | | |
|---|---|---|---|
| 4,550,264 | 10/1985 | Takahaski et al. | 326/80 |
| 5,311,083 | 5/1994 | Wanlass | 326/81 |
| 5,399,920 | 3/1995 | Van Tran | 326/34 |
| 5,412,262 | 5/1995 | Nishio et al. | 326/81 |
| 5,418,911 | 5/1995 | Zilka et al. | 326/56 |
| 5,432,467 | 7/1995 | Reddy | 326/81 |
| 5,455,526 | 10/1995 | Runas | 326/81 |
| 5,508,653 | 4/1996 | Chu et al. | 326/80 |

FOREIGN PATENT DOCUMENTS 61-172299  8/1986  Japan .
2-17658   1/1990  Japan .
6-104337  4/1994  Japan .

OTHER PUBLICATIONS

Sedra et al.; "Microelectronic Circuits"; copyright 1985 by Holt, Rinehart and Winston, Inc.; p. 338.

D. Liu, et al., "Trading Speed for Low Power by Choice of Supply and Threshold Voltages," IEEE Journal of Solid-State Circuits, vol. 28, No. 1, pp. 10–17, Jan. 1993.

Primary Examiner—Edward P. Westin
Assistant Examiner—Benjamin D. Driscoll
Attorney, Agent, or Firm—McDermott, Will & Emery

[57] ABSTRACT

A data operating circuit in which a logic combinatorial circuit and a transfer gate are built, and a controller for controlling the data operating circuit are disposed. The controller includes a drive unit for applying a drive signal to a gate of an N-channel transistor included in the transfer gate, and a control unit for controlling the operation of the drive unit. The data operating circuit is supplied with a first voltage via a first power supply line, and the controller is supplied with a second voltage that has a higher voltage value than the first voltage. A signal line for transferring an output signal of the data operating circuit to the controller is provided with a level converter for increasing the level of the output signal of the data operating circuit to a level required for the operation of the control unit. As a result, a timing skew of the transfer gate can be retained small while minimizing power consumption of the data operating circuit.

10 Claims, 3 Drawing Sheets

$VDD2 \geq VDD1 + VTHN$

PROCESSOR UTILIZING A LOW VOLTAGE DATA CIRCUIT AND A HIGH VOLTAGE CONTROLLER

BACKGROUND OF THE INVENTION

The present invention relates to a semiconductor integrated circuit which contains a logic gate and a logic combinatorial circuit, and more particularly, it relates to a semiconductor integrated circuit with low power consumption.

The power consumption in a semiconductor integrated circuit which contains a transfer gate and a logic combinatorial circuit is generally in proportion to a frequency of switching a logic gate included in the circuit and an electrostatic capacity of a node to be switched, and is also in proportion to a square of the switching amplitude. In this case, the switching amplitude is known to be equal to a supply voltage in an ordinary CMOS semiconductor integrated circuit.

Accordingly, in an attempt to decrease the power consumption in the semiconductor integrated circuit, one of the following measures should be adopted: the frequency of switching the logic gate is decreased in the step of system architecture; the capacitance of the switching node is decreased through some means in processing or designing a mask; a circuit operatable at a low voltage is somehow realized; and two or more of these measures are appropriately combined. Among these measures, the decrease of the operating voltage of the circuit can be regarded to be the most and directly effective in the decrease of power consumption because power consumption is in proportion to the square of the supply voltage.

On the other hand, it is known that power consumption can be largely decreased, not by merely decreasing the supply voltage for the circuit, bug by optimizing the parallelism and the operation cycle time of the circuit, a supply voltage and a threshold voltage of a transistor. For example, it is described that power reduction of several factors of ten can be obtained by decreasing a supply voltage and increasing the parallelism of the circuit without sacrificing the circuit performance in "Trading Speed for Low Power by Choice of Supply and Threshold Voltages" (Duke Liu, et al., IEEE Journal of Solid-State Circuits, Vol. 28, No. 1, January 1993, pp. 10–17).

There arises the following problems, however, in the attempt to decrease a supply voltage in the aforementioned conventional manner.

First, as a supply voltage is decreased, power consumption is decreased, while the delay time of a logic gate is increased. As the delay time is increased, the delay time depends more and more upon the load capacitance. It is, however, difficult to accurately estimate the load capacitance, and hence, it becomes relatively difficult to realize a low timing skew. Furthermore, when a clock system is designed using a low speed logic gate, the ramp of a waveform transferred within the integrated circuit is increased, the delay time value (i.e., clock skew) is also increased due to the change of the internal waveform caused by the variation of the process conditions, and the deviation of the delay time becomes larger. Therefore, the circuit is easily affected by the variation in the processes, resulting in a difficulty in realizing a circuit with a high yield. In addition, when the waveforms transferred within the logic circuit is ramped, a malfunction due to the effect of superimposed noise tends to occur more frequently.

In order to obtain an integrated circuit without a malfunction, it is necessary to minimize a phase difference (which is designated as a timing skew) among control signals and clocks interconnected as a network in the integrated circuit, and to accurately estimate the phase difference in the step of the design of the integrated circuit. It is well known that a small timing skew can be obtained by using a high speed logic gate in which a delay time is minimally varied by the change of the load capacitance. It is, however, difficult to simultaneously satisfy the two demands, i.e., the operation at a low voltage and a low timing skew, in the above described semiconductor integrated circuit.

Secondly, as a supply voltage is decreased, the deviation of the threshold voltage of a transistor more largely affects the delay time. This effect becomes more noticeable when the supply voltage for the integrated circuit approximates the threshold voltage of the transistor.

Thirdly, it is difficult to use an N-channel MOS transistor with a smaller layout area as a transfer gate in a logic circuit operated at a low voltage. When a logic gate using a transfer gate as the input is utilized, the output voltage is decreased by a voltage equal to the threshold voltage of the transfer gate, as the supply voltage is decreased. Accordingly, it becomes difficult to secure the margin of the output voltage of the transfer gate against the logic threshold voltage, resulting in a difficulty in realizing a high speed and definite operation of the circuit. Thus, an N-channel MOS transistor cannot be used as a transfer gate. Moreover, with regard to the supply voltage, the circuit cannot be operated around the threshold voltage of the transistor. Therefore, in order to avoid this problem of the output voltage of the transfer gate in a circuit operating at a low voltage, a complementary transfer gate in which a P-channel transistor and an N-channel transistor is connected in parallel is generally used. Such a complementary transfer gate, however, requires an extra transistor and a complementary control signal, and as a result, the usage of the complementary transfer gate capacitance of the transistor is also increased, the decrease of the logic transfer speed caused by the low voltage operation is further accelerated.

In this manner, a conventional semiconductor integrated circuit which contains a logic combinatorial circuit and a transfer gate has mainly the aforementioned three problems that are related to one another. As a result, it has been difficult to decrease power consumption in such an integrated circuit.

SUMMARY OF THE INVENTION

The fundamental object of the invention is suppressing the occurrence of the aforementioned problems, while decreasing power consumption, in a semiconductor integrated circuit including a logic combinatorial circuit and a transfer gate.

A first object is suppressing the occurrence of a timing skew resulting from low voltage operation, which is required for decreasing power consumption.

A second object is enabling a semiconductor integrated circuit to be operated at a supply voltage approximate to the threshold voltage of a transistor.

A third object is suppressing the increase of a layout area and the decrease of delay performance resulting from the complementarity of the transfer gate.

In order to attain the first object, the fundamental semiconductor integrated circuit of the invention comprises a first power supply line for supplying a first voltage, a second power supply line for supplying a second voltage that has a higher voltage value than the first voltage, a data operating circuit that is connected to the first power supply line and is formed so as to perform logical operation, and driving means that is connected to the second power supply line for generating a drive signal for driving the data operating circuit.

As a result of this configuration, the data operating circuit is driven at the lower first voltage supplied via the first power supply line, and hence, power consumption in the semiconductor integrated circuit can be decreased. Since the driving means for driving the data operating circuit is supplied with the second voltage higher than the first voltage via the second power supply line, a logic gate and the like included in the driving means are driven at a higher voltage than the data operating circuit. Accordingly, as compared with the case where these elements are driven at the same voltage as the data operating circuit, the variation in the delay time against the change of the load capacitance is decreased, resulting in a low timing skew.

The second semiconductor integrated circuit of the invention can comprise, in addition to the elements of the fundamental semiconductor integrated circuit, controlling means that is connected to the second power supply line for generating a control signal for controlling the operation of the driving means.

In this second semiconductor integrated circuit, it is possible to supply a control signal to the driving means without converting the level of the signal from the controlling means, thereby simplifying the configuration of the circuit.

The data operating circuit in the second semiconductor integrated circuit can include at least one logic combinatorial circuit and a transfer gate for controlling the transfer of a signal to be input to the logic combinatorial circuit. In this case, the drive signal generated by the driving means is applied to the gate of the transfer gate.

The logic combinatorial circuit in the data operating circuit is supplied with a signal via the transfer gate at a low voltage. Regarding to the aforementioned configuration, the capacity loaded driving ability of a signal transferred from the driving means to the gate of the transfer gate becomes large, and therefore, the signal is transferred to the logic combinatorial circuit at a low timing skew.

It is preferable that the second semiconductor integrated circuit further comprises a signal line for connecting the data operating circuit with the controlling means so as to input an output signal of the data operating circuit to the controlling means, and a level converter provided on the signal line so as to increase the level of the output signal of the data operating circuit to a level required for the operation of the controlling means.

Because of this configuration, a level converter can be omitted on a signal transmission line from the controller to the data operating circuit, where the level conversion is not necessary.

Furthermore, the controlling means is preferably formed so as to input and output a data to and from the data operating circuit.

Although it is necessary to output a signal from the data operating circuit at a high voltage, this configuration enables a signal having passed through the level converting means to be output from the controlling means, and a signal to be input through the controlling means. Therefore, there is no need to provide an extra level converter. Thus, the number of required level converters can be reduced. In addition, a noise is prevented from being input to the data operating circuit from an external circuit, resulting in satisfactorily retaining the logic level.

It is preferable that the second semiconductor integrated circuit further comprises a clock circuit including second driving means that is supplied with the second voltage via the second power supply line for generating a drive signal for driving the data operating circuit, and second controlling means that is supplied with the second voltage via the second power supply line for generating a second control signal for controlling the second driving means.

Since the higher second voltage is supplied to the clock circuit in this configuration, a low clock skew can be realized in the semiconductor integrated circuit with low power consumption.

The second semiconductor integrated circuit is applicable to a microprocessor including a data path, a control path and an I/O device. In this case, the data operating circuit corresponds to the data path in the microprocessor, the driving means and the controlling means are contained in the control path in the microprocessor, and the first power supply line and the second power supply line are connected to the data path and the control path, respectively. In addition to these elements, the microprocessor comprises a signal line for connecting the data path with the control path so as to input an output signal of the data path to the control path, and a level converter that is provided on the signal line so as to increase the level of the output signal of the data path to a level required for the operation of the controlling means.

This configuration enables the formation of a microprocessor with low power consumption and a small timing skew.

Furthermore, the third semiconductor integrated circuit of the invention comprises, in addition to the elements of the fundamental semiconductor integrated circuit, controlling means that is supplied with the first voltage via the first power supply line for generating a control signal for controlling the operation of the driving means, and a level converter that is provided between the controlling means and the driving means so as to increase the level of the control signal to a level required for the operation of the driving means.

As a result of this configuration, the controlling means is operated at the lower first voltage supplied via the first power supply line, and hence, power consumption can be minimized even when the circuit scale of the controlling means is large.

The third semiconductor integrated circuit can further comprise a clock circuit including second driving means that is supplied with the second voltage via the second power supply line for generating a drive signal for controlling the data operating circuit, second controlling means that is supplied with the first voltage via the first power supply line for generating a second control signal for controlling the second driving means, and a second level converter that is provided between the second controlling means and the second driving means so as to increase the level of the second control signal to a level required for the operation of the driving means.

Furthermore, the data operating circuit in the third semiconductor integrated circuit can include at least one logic combinatorial circuit and a transfer gate for controlling the transfer of a signal to be input to the logic combinatorial circuit. In this case, the drive signal generated by the driving means can be applied at least to the gate of the transfer gate.

To attain the second and third objects, in the fourth semiconductor integrated circuit of the invention, a CMOS semiconductor integrated circuit is used as the semiconductor integrated circuit in the second or third semiconductor integrated circuit, and the data operating circuit includes at least one logic combinatorial circuit and a transfer gate formed with an N-channel transistor for controlling the transfer of a signal to be input to the logic combinatorial circuit. Further, the drive signal generated by the driving means is applied at least to the gate of the transfer gate, and the maximum voltage of the drive signal generated by the driving means exceeds a voltage obtained by adding the first voltage to the threshold voltage of the N-channel transistor.

Owing to this configuration, the output signal from the transfer gate attains an amplitude larger than that of the first voltage, that is, the supply voltage for the data operating circuit. Accordingly, an N-channel transistor can be used in the transfer gate in a low voltage driving type data operating circuit. As a result, the layout area can be decreased as compared with the case where a complementary transistor is used. Furthermore, since the circuit is operated at a voltage higher than the threshold voltage of the transistor forming the transfer gate, the increase of the delay time resulting from the deviation of the threshold voltage of the transistor can be avoided.

In the fourth semiconductor integrated circuit, when the N-channel transistor has a channel length of 0.5 μm or less, the second voltage can exceed the threshold voltage of the N-channel transistor and the first voltage can be below the threshold voltage of the N-channel transistor.

When the N-channel transistor has a channel length of 0.5 μm or less, a sufficiently high operation speed can be attained even at a low gate voltage. Therefore, when the first voltage is below the threshold voltage of the N-channel transistor and the second voltage exceeds the threshold voltage of the N-channel transistor, a low timing skew can be retained. As a result, the power consumption can be further decreased.

In particular, when the second voltage is lower than 1 V, the semiconductor integrated circuit can attain extremely low power consumption.

DETAILED DESCRIPTION OF THE INVENTION (Embodiment 1)

Figure 1:
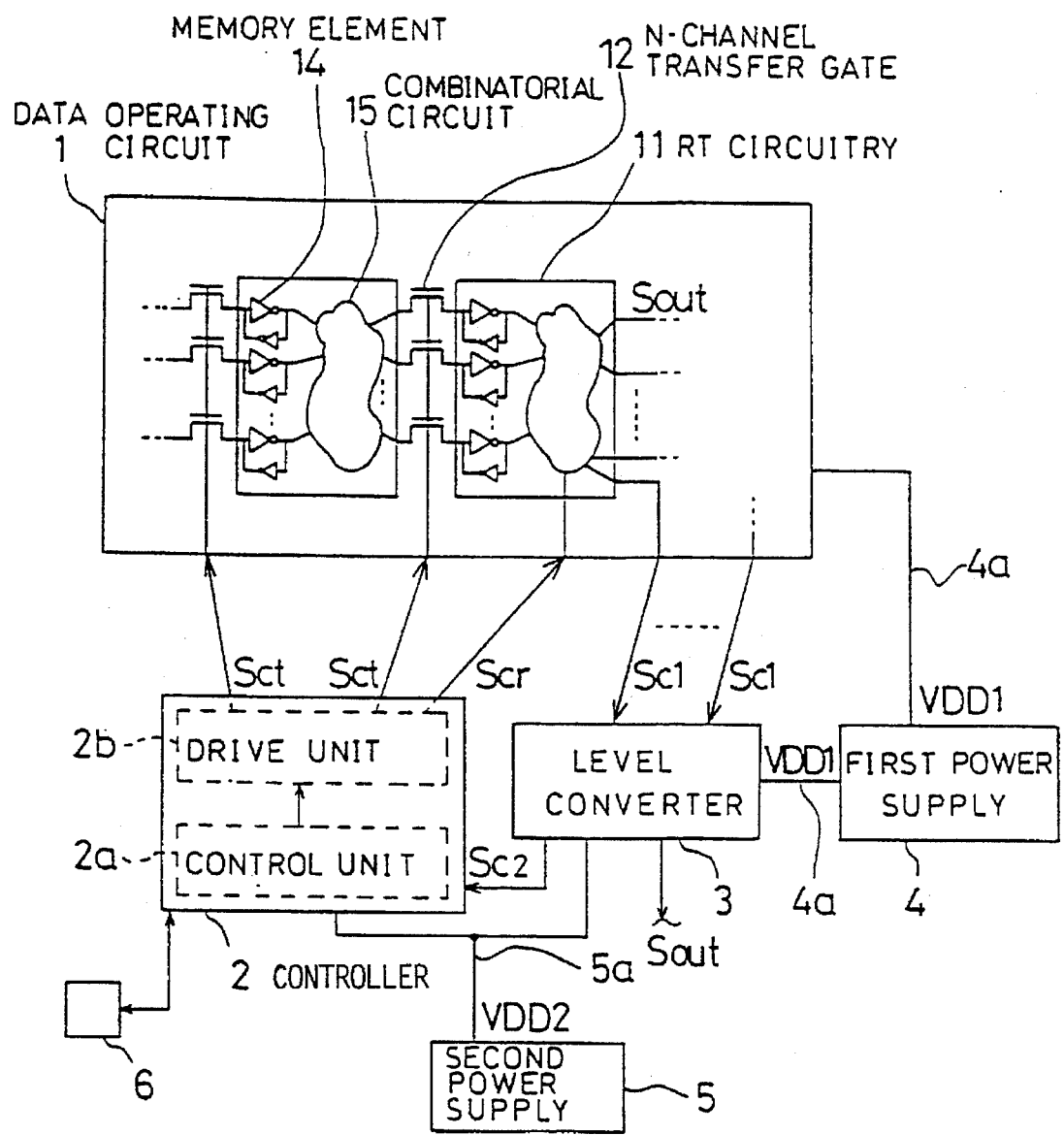
FIG. 1 is an electrical circuit diagram of a low power consumption type semiconductor integrated circuit according to Embodiment 1 of the invention.

Embodiment 1 of the invention will now be described referring to FIG. 1. FIG. 1 is a block diagram of the configuration of a CMOS semiconductor integrated circuit according to Embodiment 1. As is shown in FIG. 1, the semiconductor integrated circuit comprises a data operating circuit 1 for processing a data therein, a controller 2 for controlling the drive of the data operating circuit 1, a level converter 3 for supplying a level converted control signal to the controller 2, and an I/O pin 6 to be used for receiving and supplying a signal between an external circuit and the controller 2. External to the semiconductor integrated circuit is a first power supply 4 for supplying power at a first voltage VDD1 and a second power supply 5 for supplying power at a second voltage VDD2 that is higher than the first voltage VDD1. The first power supply 4 and the second power supply 5 are connected to the semiconductor integrated circuit via a first power supply line 4a and a second power supply line 5a, respectively. The data operating circuit 1 is supplied with the first voltage VDD1 by the first power supply 4, the controller 2 is supplied with the second voltage VDD2 by the second power supply 5, and the level converter 3 is supplied with power by both the first power supply 4 and the second power supply 5.

The controller 2 can be a sequential circuit or a combinatorial circuit including a memory device such as a DRAM, an SRAM and a ROM, and a memory.

The data operating circuit 1 is basically formed with a combination of RT circuitries 11 and N-channel transfer gates 12. Each RT circuitry 11 includes a memory element 14 and a logic combinatorial circuit 15.

The first voltage VDD1 of the first power supply 4 and the second voltage VDD2 of the second power supply 5 are set so that the following relationship be satisfied:

$$VDD2 \geq VDD1 + VTHN \tag{1}$$

wherein VTHN indicates the threshold voltage of the N-channel transfer gate 12.

Since the first voltage VDD1 of the first power supply 4 is applied to the data operating circuit 1 as above, the signal amplitude of the RT circuitry 11 in the data operating circuit 1 is VDD1. Data is input and output between the external of the semiconductor integrated circuit and the data operating circuit 1 through the external I/O pin 6 via the controller 2. At this point, for example, the RT circuitry 11 is a circuit expressed by a register transfer level.

Furthermore, the controller 2 comprises a drive unit 2a serving as driving means for generating control signals Sct and Scr for driving the data operating circuit 1, and a control unit 2b serving as controlling means for controlling the operation of the drive unit 2a. The drive unit 2b supplies the data operating circuit 1 with the control signal Sct for driving the N-channel transfer gate 12 and the control signal Scr for driving the logic combinatorial circuit 15. Since the supply voltage for the controller 2 is the second voltage VDD2, the signal amplitude of the control signals Sct and Scr is VDD2. The control signals Sct and Scr with the signal amplitude of VDD2 are input to the gate of the N-channel transfer gate 12 and the logic combinatorial circuit 15, respectively, thereby determining the transfer of the signals among the RT circuitries 11 and the logic in the logic combinatorial circuit 15.

Generally, the maximum voltage of a signal that can be transferred by the N-channel transfer gate 12 is obtained by subtracting the threshold voltage VTHN of the N-channel transfer gate 12 from the signal amplitude of the gate electrode. Since the second voltage VDD2 is applied to the gate electrode of the N-channel transfer gate 12 in this embodiment, a signal with an amplitude up to (VDD2−VTHN) can be transferred without decreasing the voltage. The signal amplitude of the RT circuitry 11 in the data operating circuit 1 is VDD1, and the supply voltage is applied so as to satisfy VDD1 ≤ VDD2−VTHN based on the relationship (1). Accordingly, it is possible to transfer a signal, while retaining the amplitude VDD1, among the RT circuitries 11 even when using the N-channel transfer gate 12. Thus, it is possible to use an N-channel transfer gate that does not degrade the signal transfer characteristic, resulting in minimizing the layout area. In other words, data transfer with a small electrostatic capacity can be realized.

When a control signal Sc1 with the signal amplitude VDD1 is input by the RT circuitry 11 to the level converter 3, the control signal Sc1 is converted into a control signal Sc2 (i.e., a level converted control signal) with the signal amplitude VDD2 in the level converter 3, and the control signal Sc2 is supplied to the controller 2 as a control signal. At this point, the control signal Sc1 is a signal required when the data operating circuit 1 performs data flow control operation, i.e., when a data is externally supplied to the data operating circuit 1 and the data operating circuit 1 changes the processes to be performed in accordance with the condition of the supplied data.

In a CMOS semiconductor integrated circuit, there is no need to convert the level of a signal in transferring the signal from one circuit with a higher supply voltage to another circuit with a lower supply voltage. In transferring a logic signal, the logical threshold voltage of a logic gate serving as the input port is generally required to be lower than the voltage of the output port. Since this condition is always satisfied with regard to the control signal Scr output to the data operating circuit 1 from the controller 2 in this embodiment, there is no need to provide a level converter on a signal transmission line from the controller 2 to the data operating circuit 1. As a result of this, the ievel converter 3 is provided merely on the signal transmission line from the data operating circuit 1 to the controller 2 even when a double power supply system is adopted. Therefore, the increase of the circuit scale resulting from the double power supply system can be minimized.

Furthermore, when a data is supplied to and from an external circuit with a large logic amplitude, the level converter 3 can be effectively utilized by supplying the data to and from the external device via the I/0 pin 6 provided to the controller 2.

In addition, since the supply voltage for the controller 2 is larger than that for the data operating circuit 1, the capacity loaded driving ability of the logic gate included in the controller 2 can be increased without using a large-sized transistor. The reason is as follows: The delay time Td of a logic gate driving an interconnection is substantially represented by the following equation (2):

$$Td = TO + R*CL + r*CL$$

wherein CL indicates the load capacitance of the interconnection, r indicates the resistance of the interconnection, R indicates the ON resistance of the logic gate, and TO indicates the delay time under no load. In an ordinary logic gate, the second and third terms in equation (2) occupy most of the delay time Td. The load capacitance CL of the interconnection depends upon the shape of the layout, and has a relatively large error as compared with the ON resistance R, which can be definitely determined based on a SPICE parameter or the like used for simulation in a circuit simulator, because the load capacitance CL is electrically affected mutually by adjacent layouts. When a supply voltage is low, the value of the ON resistance R is increased, and the indefinite load capacitance CL occupies a larger proportion in the delay time Td, resulting in decreasing the accuracy for estimating the delay time Td. When a difference in the delay time Td among respective elements becomes large, there arises a problem that a skew, which is represented as a difference in the delay time Td, cannot be retained small.

In this embodiment, however, the skew in the circuit can be retained small by maintaining large the loaded driving ability of the controller 2. Specifically, when the data operating circuit 1 and the controller 2 are separately laid out as different layout blocks, the load capacitance CL against the control signal Sct or Scr tends to be increased because the interconnection between the blocks should be extended. However, the skew can be retained small when the supply voltage for the controller 2 is as high as the second voltage VDD2 as in this embodiment.

Furthermore, with regard to the control signal Sc1 driven by a low driving ability, the load capacitance CL can be minimized by providing the level converter 3 in the vicinity of the data operating circuit 1, so as to drive an interconnection with a large load capacitance CL by using the control signal Sc2 with a high driving ability obtained through the level conversion. As a results, the skew can be minimized.

Setting of specific values for the voltages VDD1 and VDD2 of the first and second power supplies 4 and 5 are described as follows. In order to attain an interface with another device at a standard supply voltage, the threshold voltage of the N-channel transfer gate 12 is approximately 0.4 to 0.7 V. Therefore, in the case of 3 V system operation, when the second voltage VDD2 is 3 V, the first voltage VDD1 is set to be equal or lower than 2.3 V. When the second voltage VDD2 is 3.3 V, the first voltage VDD1 is set to be equal or lower than 2.6 V.

Furthermore, in a semiconductor integrated circuit with a channel length of 0.5 μm or smaller, a sufficient operation speed can be attained even at an operating voltage of 3 V or lower. For example, when an external circuit is operated at 2 V, the first voltage VDD1 is set to be equal or lower than 1.5 V. Moreover, in order to attain extremely low power consumption, the subthreshold characteristic of the transistor can be optimized so as to set the supply voltage within the subthreshold region of the transistor. In this case; for example, the first voltage VDD1 is set to exceed 0.7 V, that is, the subthreshold voltage of the N-channel transistor, and the second voltage VDD2 is set to be lower than 0.7 V, the subthreshold voltage of the N-channel transistor.

As described above, according to this embodiment, low power consumption can be attained by lowering the operating voltage of the circuit, while a high supply voltage is selectively supplied to a circuit requiring to ensure timing such as a skew. As a result, the device can attain both low power consumption and a high operation speed. Furthermore, the N-channel transfer gate 12 can be used in the data operating circuit 1 by making the supply voltage for the drive unit 2b in the controller 2 larger than the subthreshold voltage of the N-channel transistor, thereby decreasing the layout area and the drain capacitance. As a result, the device can attain further low power consumption and a high speed operation in the low voltage region.

While the entire controller 2 is supplied with a high voltage, the high voltage is supplied merely to the drive unit 2b for driving the control signal as in the following Embodiment 2. As the drive unit 2b, for example, a clock driver can be used. In the case where merely the drive unit 2b is supplied with a high voltage, however, a level converter should be provided so that another circuit driven at a low voltage can drive the drive unit 2b.

(Embodiment 2)

Figure 2:
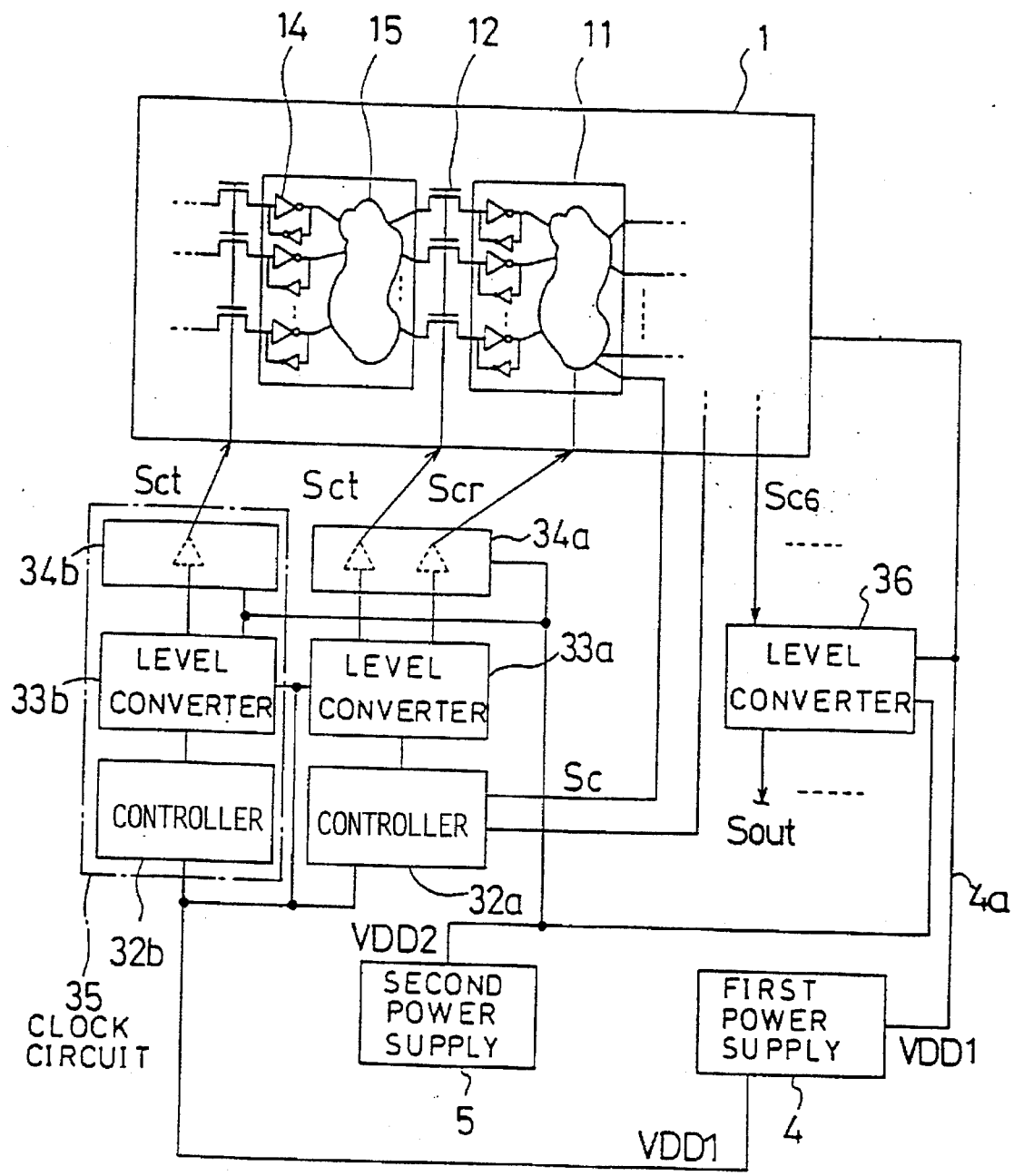
FIG. 2 is an electrical circuit diagram of a low power consumption type semiconductor integrated circuit according to Embodiment 2 of the invention.

Embodiment 2 of the invention will now be described refers ring to FIG. 2. As is shown in FIG. 2, the configuration of a semiconductor integrated circuit of Embodiment 2 is basically identical to that of Embodiment 1. In this embodiment, however, a level converter 33a is provided between a driver 34a serving as driving means and a controller 32a serving as controlling means. Further, a clock circuit 35 is also provided with a controller 32b, a driver 34b and a level converter 33b. The power supply for the clock circuit 35 is separated as a clock system power supply from the other power supplies, and a second power supply 5 supplies a second voltage VDD2 to the level converter 33b and the driver 34b via a second power supply line 5a. The controllers 32a and 32b and a data operating circuit 1 are supplied with a first voltage VDD1 by a first power supply 4 via a first power supply line 5a. Among output signals of the data operating circuit 1, a control signal Sc5 that is to be fed back to a controller 2 is applied to the controllers 32a and 32b without level conversion. A control signal Sc6 that is to be output to an external circuit is output via another level converter 36 to the external circuit. The level converter 36 is supplied with a voltage by both the first and second power supplies 4 and 5.

Therefore, in this embodiment, although the controllers 32a and 32b are also supplied with the lower voltage, a similar effect to that achieved in Embodiment 1 can be attained since the level of the signal is converted before entering the drivers 34a and 34b. In particular, since the voltage used in the system of the clock circuit 35 is retained high, power consumption in the entire integrated circuit can be decreased while suppressing a clock skew.

(Embodiment 3)

Figure 3:
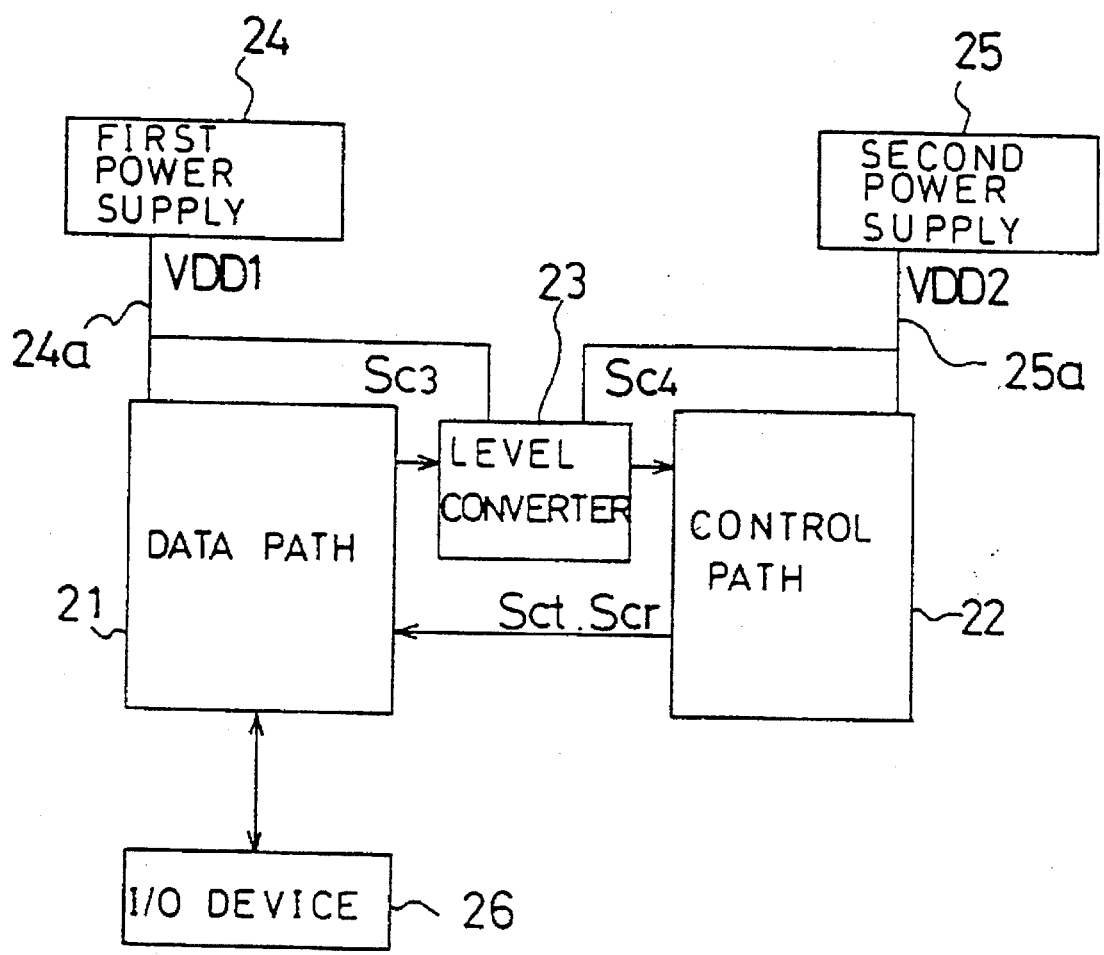
FIG. 3 is a schematic block diagram of the configuration of a low power consumption type microprocessor according to Embodiment 3 of the invention.

FIG. 3 is a diagram of the configuration of a microprocessor used in Embodiment 3 of the invention. As is shown in FIG. 3, the microprocessor comprises a data path 21 connected to a first power supply line 24a for supplying a first voltage VDD1, a control path 22 connected to a second power supply 25 via a second power supply line 25a for supplying a second voltage VDD2, a level converter 23 provided on a signal line extending from the data path 21 to the control path 22, and an I/O device 26 to be used for receiving and supplying a signal between the data path 21 and an external circuit. A control signal Sc3 transferred from the data path 21 is subjected to level conversion in the level converter 23 so as to be converted into a control signal Sc4, which is supplied to the control path 22. Control signals Sct and Scr transferred from the control path 22 are supplied to the data path 21 without level conversion.

The data path 21 is formed with an ALU, a register file, a shifter and the like. The control path 22 is formed with a random logic including a control register.

Also according to this embodiment, a microprocessor can attain low power consumption as in Embodiments 1 and 2.

We claim:

1. A semiconductor integrated circuit, wherein said semiconductor integrated circuit is a CMOS semiconductor integrated circuit, comprising:

a first power supply line for supplying a first voltage;

a second power supply line for supplying a second voltage that has a higher voltage value than the first voltage;

a data operating circuit that is connected to said first power supply line and is formed so as to perform a logical operation, said data operating circuit includes at least one logic combinatorial circuit and a transfer gate for controlling transfer of a signal to be input to said logic combinatorial circuit, said transfer gate in said data operating circuit is formed with an N-channel transistor, wherein said N-channel transistor has a channel length of 0.5 µm or less;

said second voltage exceeds the threshold voltage of said N-channel transistor of the transfer gate, and said first voltage is below the threshold voltage of said N-channel transistor of the transfer gate;

driving means connected to said second power supply line for generating a drive signal for driving said data operating circuit, said drive signal generated by said driving means is applied at least to a gate of said transfer gate;

a maximum voltage of said drive signal generated by said driving means exceeds a voltage obtained by adding the first voltage to a threshold voltage of said N-channel transistor; and controlling means connected to said second power supply line for generating a control signal for controlling operation of said driving means.

2. The semiconductor integrated circuit of claim 1, wherein the second voltage does not exceed 1 V.

3. A semiconductor integrated circuit comprising:

a first power supply line for supplying a first voltage;

a second power supply line for supplying a second voltage that has a higher voltage value than the first voltage;

a data operating circuit that is connected to said first power supply line and is formed so as to perform a logical operation, said data operating circuit corresponds to said data path of said microprocessor;

driving means connected to said second power supply line for generating a drive signal for driving said data operating circuit; and controlling means connected to said second power supply line for generating a control signal for controlling operation of said driving means, said driving means and said controlling means are contained in said control path of said microprocessor wherein said semiconductor integrated circuit is a microprocessor including a data path, a control path and an I/O device, said first power supply line is connected to said data path and said second power supply line is connected to said control path;

said microprocessor further comprising:

a signal line for connecting said data path with said control path so as to input an output signal of said data path to said control path; and a level converter that is provided on said signal line so as to increase a level of the output signal of said data path to a level required for operation of said controlling means in said control path.

4. A semiconductor integrated circuit comprising:

a first power supply line for supplying a first voltage;

a second power supply line for supplying a second voltage that has a higher voltage value than the first voltage;

a data operating circuit that is connected to said first power supply line and is formed so as to perform a logical operation;

driving means connected to said second power supply line for generating a drive signal for driving said data operating circuit;

controlling means connected to said second power supply line for generating a control signal for controlling operation of said driving means;

a signal line for connecting said data operating circuit with said controlling means so as to input an output signal of said data operating circuit to said controlling means; and a level converter provided on said signal line for converting a level of the output signal of said data operating circuit into a level required for operation of said controlling means.

5. The semiconductor integrated circuit of claim 4, wherein said controlling means is formed so as to input and output a data to and from said data operating circuit.

6. A semiconductor integrated circuit comprising:

a first power supply line for supplying a first voltage;

a second power supply line for supplying a second voltage that has a higher voltage value than the first voltage;

a data operating circuit that is connected to said first power supply line and is formed so as to perform a logical operation;

a plurality of driving means connected to said second power supply line for generating a drive signal for driving said data operating circuit;

a plurality of controlling means that are supplied with the first voltage via said first power supply line for generating a control signal for controlling operation of said plurality of driving means; and a level converter provided between said plurality of controlling means and said plurality of driving means so as to increase a level of the control signal to a level required for operation of said plurality of driving means.

7. The semiconductor integrated circuit of claim 6, further comprising:

second driving means that is supplied with the second voltage via said second power line for generating a drive signal for driving said data operating circuit, second controlling means that is supplied with the first voltage via said first power supply line for generating a second control signal for controlling said second driving means, and a second level converter provided between said second controlling means and said second driving means so as to increase a level of the second control signal to a level required for operation of said driving means.

8. The semiconductor integrated circuit of claim 7, wherein said semiconductor integrated circuit is a CMOS semiconductor integrated circuit, said transfer gate in said data operating circuit is formed with an N-channel transistor, and a maximum voltage of the drive signal generated by said driving means exceeds a voltage obtained by adding the first voltage to a threshold voltage of said N-channel transistor.

9. The semiconductor integrated circuit of claim 8, wherein said N-channel transistor has a channel length of 0.5 µm or less, the second voltage exceeds the threshold voltage of said N-channel transistor, and the first voltage is below the threshold voltage of said N-channel transistor.

10. The semiconductor integrated circuit of claim 9, wherein the second voltage does not exceed 1 V.

* * * * *